(12) United States Patent
Bijlsma et al.

(10) Patent No.: US 9,458,973 B2
(45) Date of Patent: Oct. 4, 2016

(54) OPTICAL ELEMENT FOR UNIFORM LIGHTING

(71) Applicant: KONINKLIJKE PHILIPS N.V., Eindhoven (NL)

(72) Inventors: Albert Bijlsma, Eindhoven (NL); Rifat Ata Mustafa Hikmet, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 117 days.

(21) Appl. No.: 14/378,176

(22) PCT Filed: Feb. 12, 2013

(86) PCT No.: PCT/IB2013/051131
§ 371 (c)(1),
(2) Date: Aug. 12, 2014

(87) PCT Pub. No.: WO2013/121347
PCT Pub. Date: Aug. 22, 2013

(65) Prior Publication Data
US 2015/0003060 A1    Jan. 1, 2015

Related U.S. Application Data

(60) Provisional application No. 61/599,453, filed on Feb. 16, 2012.

(51) Int. Cl.
| | |
|---|---|
| *F21V 5/04* | (2006.01) |
| *F21K 99/00* | (2016.01) |
| *G02B 19/00* | (2006.01) |
| *G02B 5/04* | (2006.01) |

(Continued)

(52) U.S. Cl.
CPC ............. *F21K 9/58* (2013.01); *G02B 5/045* (2013.01); *G02B 19/0009* (2013.01); *G02B 19/0066* (2013.01); *F21Y 2101/02* (2013.01); *H01L 33/58* (2013.01)

(58) Field of Classification Search
CPC .......... F21Y 2101/02; G02B 19/0009; G02B 19/0066; G02B 5/045; F21V 5/04; F21V 5/045; F21V 5/007; F21V 5/005; F21V 5/02; H01L 33/58
See application file for complete search history.

(56) References Cited

U.S. PATENT DOCUMENTS

| | | | |
|---|---|---|---|
| 6,821,804 B2 | 11/2004 | Thibeault | |
| 7,352,011 B2* | 4/2008 | Smits | H01L 33/54 257/100 |

(Continued)

FOREIGN PATENT DOCUMENTS

| | | |
|---|---|---|
| CN | 101036501 A | 1/2011 |
| CN | 201779526 U | 3/2011 |
| CN | 102282416 A | 12/2011 |

*Primary Examiner* — Peggy Neils

(57) ABSTRACT

There is provided an optical element for use with a LED wherein a base face is arranged to receive incoming light from the LED. The optical element comprises a top face having a pattern of optical structures which refract light away from an optical axis (A) of the optical element. Further the optical element comprises a plurality of side faces extending between the top face and the base face and arranged to refract light from the light towards the optical axis (A). the top face extends such that it covers a first angular range relative to the optical axis (A). The first angular range is an angular range outside which light emitted by the LED would be subject to total internal reflection at an imaginary extension of the top face.

14 Claims, 6 Drawing Sheets

(51) Int. Cl.
*H01L 33/58* (2010.01)
*F21Y 101/02* (2006.01)

(56) References Cited

U.S. PATENT DOCUMENTS

| | | | |
|---|---|---|---|
| 7,582,913 B2* | 9/2009 | Huang | G02B 3/04 |
| | | | 257/98 |
| 2006/0044806 A1* | 3/2006 | Abramov | F21V 5/007 |
| | | | 362/337 |
| 2006/0203490 A1 | 9/2006 | Saccomanno | |
| 2007/0258247 A1* | 11/2007 | Park | G02B 5/0231 |
| | | | 362/326 |
| 2009/0067175 A1* | 3/2009 | Chen | G02B 17/086 |
| | | | 362/255 |
| 2010/0039812 A1 | 2/2010 | Chenk | |
| 2010/0246173 A1 | 9/2010 | Wei | |
| 2011/0032712 A1 | 2/2011 | Dias et al. | |
| 2011/0292670 A1* | 12/2011 | Hara | F21S 48/215 |
| | | | 362/519 |

* cited by examiner

OPTICAL ELEMENT FOR UNIFORM LIGHTING

CROSS-REFERENCE TO PRIOR APPLICATIONS

This application is the U.S. National Phase application under 35 U.S.C. §371 of International Application No. PCT/IB2013/051131, filed on Feb. 12, 2013, which claims the benefit of U.S. Provisional Patent Application No. 61/599,453, filed on Feb. 16, 2012. These applications are hereby incorporated by reference herein.

FIELD OF THE INVENTION

The present invention relates to the field of light emitting diodes (LED). In particular it relates to a refractive optical element for use with a LED.

BACKGROUND OF THE INVENTION

In recent years, the popularity of using LEDs in luminaires has increased. In order to obtain cost-efficient solutions, it is common to place several high power and/or medium power LEDs at a certain distance from each other in a luminaire. However, this has as a drawback that the luminaire will have a spotty appearance when in use, due to the irregular illumination pattern caused by the different LEDs.

Further, LEDs sometimes are used with colour converting layers, such as organic phosphor layers, in order to have an output light which is perceived as white by a user although blue LEDs are used. However, when having several LEDs in a luminaire, hot spots may be induced in the colour converting layer, which in the end leads to a reduced lifetime of the luminaire.

There have been attempts to overcome the above drawbacks by introducing diffuser elements in the luminaire in order to spread the light of the LEDs and thereby achieve a more uniform illumination pattern. However, these attempts suffer from reduced system efficiency and increased costs.

CN201779526 discloses a light source which comprises LED chips being fixed to a substrate. On top of each LED chip there is a thin light transmitting layer and on the side surfaces of the LED chip there are inclined structures which refract horizontally emergent light upwards. The disclosed LED light source is inter alia alleged to increase the radiating effect of the LEDs.

Although several attempts have been made to overcome the difficulties above, there is still room for improvements.

SUMMARY OF THE INVENTION

It is an object of the present invention to overcome or mitigate the above problems, and to provide an optical element for use with a LED which provides a more uniform illumination pattern in combination with low efficiency losses.

According to a first aspect of the invention, this and other objects are achieved by an optical element for use with a LED, comprising a base face arranged to receive incoming light from the LED, a top face having a normal extending in a direction from the base face to the top face and defining an optical axis, wherein the top face extends such that it covers a first angular range relative to the optical axis, outside of which first angular range light emitted by at least one point of the LED would be subject to total internal reflection at an imaginary extension of the top face, and wherein the top face comprises a first pattern of first optical structures which are arranged to refract light originating from the LED away from the optical axis; and a plurality of side faces extending between the base face and the top face and arranged to refract light originating from the LED towards the optical axis.

By the feature that light emitted by at least one point of the LED would be subject to total internal reflection (TIR) at an imaginary extension of the top face is meant that if the top face had extended any further, light emitted by at least one point of the LED would be subject to TIR at the top face. Thus, as further explained below, no TIR occurs within the first angular range.

By having a pattern of structures on the top face which refracts incident light away from the optical axis, and by having side faces arranged to refract incident light towards the optical axis, the incident light is spread out. Particularly, the first pattern of structures on the top face enhances a widening of the light output. As a result, a more uniform illumination pattern is achieved compared to the case that no optical element is used. This is particularly advantageous if several LEDs are arranged at a distance from each other in a light source, since the spotty appearance of the light source is reduced due to the spreading of the light.

Further, the optical element leads to very low efficiency losses. More specifically, energy losses may occur if total internal reflection takes place and the light emitted by the LED is directed back towards the LED where it may be absorbed. For example, such TIR could occur in the top face or the side faces of the optical element. However, with the present invention, the dimensions of the top face are chosen such that TIR cannot take place in the top face. More specifically, the top face extends such that it only covers a first angular range outside of which light emitted by at least one point of the LED would be subject to TIR. Hence no TIR takes place at the top face and the efficiency losses are thereby reduced. Moreover, since the side faces refract rays towards the optical axis, the risk that the rays will hit any obstruction such as adjacent LEDs or side walls before reaching a target surface is reduced. In this way, the side faces also contribute to the reduction of efficiency losses.

A further advantage is that the optical elements easily may be incorporated into LED packages during the manufacture of the LEDs and hence increase the functionality of a LED arrangement without increasing the cost significantly.

The plurality of side faces may further be inclined with respect to the optical axis. In this way, the TIR taking place at the side faces may be reduced. For example, the angle of inclination may be chosen such that TIR is avoided in the side faces, wherein the angle with respect to the optical axis is not equal to 90 degrees, for example larger than 90 degrees. If TIR takes place at the side faces, light emitted by the LED is spread out above the LED in mainly one direction. As an alternative to the side faces being straight and inclined with respect to the optical axis, the side faces may have a curved shape.

At least one of the plurality of side faces may comprise a first portion and a second portion having different inclinations or angles with respect to the optical axis. By tuning the inclinations or angles of the first portion and the second portion with respect to the optical axis, better control of the direction of the emitted light is achieved. As a result, the spotty appearance of a light source comprising several LEDs may be reduced further. In one embodiment, the number of portions of a side face having different inclinations is larger than two. The number of portions having different inclinations may be the same for all side faces or may be different for different side faces. For example, one side face may have two portions with different inclinations and another side face may have three portions with different inclinations.

In one embodiment, all side faces have the same inclination or angle with respect to the optical axis. This may be advantageous in that a symmetrical illumination pattern may be achieved. Similarly, all side faces may have the same dimensions. Having a symmetrical geometry of the optical element is advantageous in several aspects. For example, symmetrical optical elements are advantageous in that they are less sensitive to the orientation of the optical elements than non-symmetrical optical elements. This simplifies post-processing such as installation of the optical elements since a user does not have to consider the orientation of the optical element during installation. Symmetrical optical elements may also be advantageous from a manufacturing point of view depending on what type of manufacturing process is used. The first pattern of the top face may extend to at least one of the plurality of side faces. For example, the pattern of structures may extend to two of the side faces or to all of the side faces. This is advantageous in that a better spread of light in the side directions of the optical element, that is the directions perpendicular to the optical axis, may be achieved.

The optical element may comprise an extension of the top face which extends such that it exclusively covers a second angular range extending outwardly of the first angular range. The extension of the top face comprises a second pattern comprising second optical structures having top surfaces which are oriented to form an angle larger than 90 degrees relative to the optical axis. If the extension of the top face would not have any second pattern of second optical structures, TIR would occur in the extension of the top face. However, by including a second pattern of second optical structures having top surfaces which are oriented to form an angle larger than 90 degrees relative to the optical axis, the light output from the extension of the top face can be controlled such that the occurrence of TIR is reduced. As a consequence, the second pattern of structures provides for an increased collimation of the light output. However, as the occurrence of TIR is reduced, the second pattern increases the efficiency as light is not redirected towards the LED by which it may be absorbed. The embodiment with an extended top face may be particularly useful if the physical dimensions of the top face cannot, for example for design and/or construction reasons, be restricted to the angular range where TIR does not take place.

The first optical structures of the top face may each have a top surface which is oriented to form an angle being smaller than 90° with respect to the optical axis, wherein the angle increases as the distance to the centre of the top face increases. For example, the first optical structures may be saw-tooth shaped in cross-section. In this way, the refractive power of the structures on the top face is higher in the middle of the top face, where the intensity of incident light is relatively high, compared to at the edges, where the light intensity is lower.

The first optical structures may be arranged in a one-dimensional pattern. For example, the pattern may comprise ridge-shaped structures being arranged adjacent to each other. In this way, the light is spread in one direction. This may be particularly advantageous if the optical element is used in a light source with a one-dimensional array of LEDs. Alternatively, the first optical structures may be arranged in a two-dimensional pattern. If so, the light is spread in two directions. This may be particularly advantageous if the optical element is used in a light source with a two-dimensional array of LEDs.

According to a second aspect of the invention, this and other objects are achieved by a light emitting device comprising an optical element according to the first aspect being formed integrally with a LED.

According to a third aspect of the invention, this and other objects are achieved by a LED arrangement comprising a LED, and an optical element according to the first aspect, the optical element being associated with the LED.

The LED arrangement may further comprise a plurality of LEDs and a plurality of optical elements according to the first aspect, each of the plurality of LEDs being associated with one of the plurality of optical elements. The plurality of LEDs and their associated plurality of optical elements may be arranged in a one-dimensional array. Alternatively, the plurality of LEDs and their associated plurality of optical elements may be arranged in a two-dimensional array.

The advantages of the first aspect generally apply to the second and third aspects. It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1A:
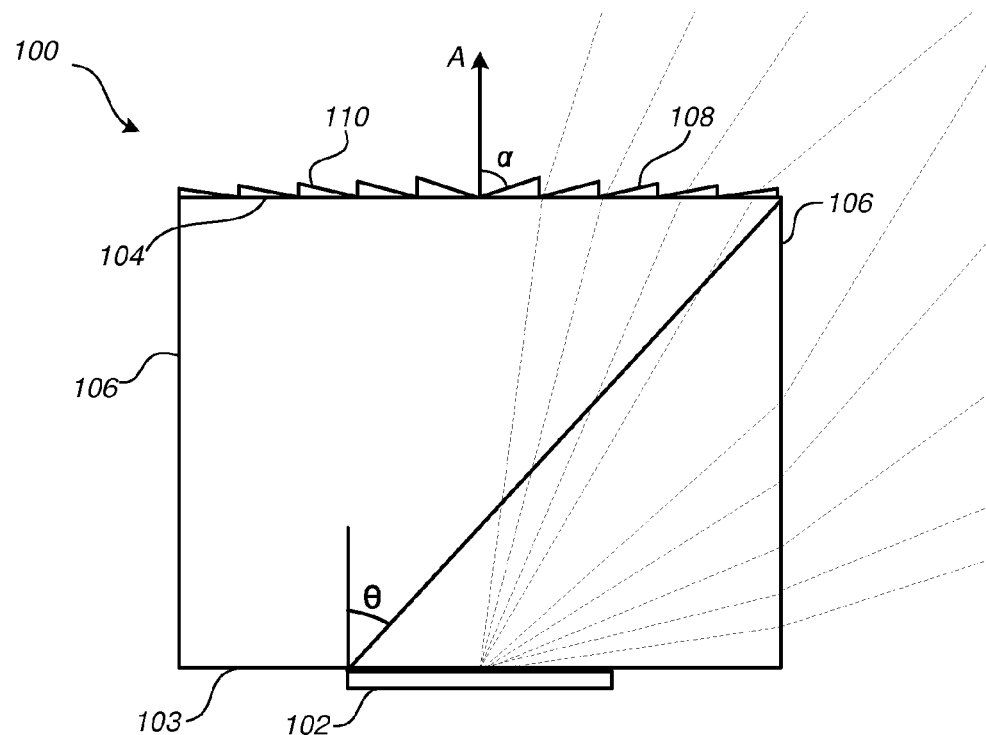
FIGS. 1a-b and FIGS. 2-3 are side views of an optical element used together with a LED according to embodiments.

FIG. 1a illustrates an optical element 100 which is arranged to be used together with a LED 102. The size of the emitting area of the illustrated LED 102 represents the size of the emitting area of the LED die. The optical element 100 may be placed on top of the LED 102. The optical element 100 may either be an element which is separate from the LED 102 or may be formed integrally with the LED 102.

The optical element 100 is a solid transparent structure which has a base face 103, a top face 104 and a plurality of side faces 106. The top face 104 is parallel to the base face 103 and is located at a distance from the base face 103. The side faces 106 extend between the base face 103 and the top face 104. The LED 102 is arranged at the base face 103 such that light emitted by the LED 102 enters the optical element 100 at the base face 103. The number of side faces 106 may vary. Preferably, however, the optical element 100 comprises four side faces 106. The geometrical dimensions of the side faces 106 may be different or the same. The optical element 100 further has an optical axis A which is defined by a normal of the top face 104, which is essentially perpendicular to the top face 104 and the base face 103 and extends in a direction from the base face 103 to the top face 104.

The top face 104 has a first pattern 108 on its upper side facing away from the LED 102. As illustrated, the first pattern 108 comprises first optical structures 110 which are arranged to refract light originating from the LED 102 away from the optical axis A. This may for example be achieved by the first optical structures 110 having top facets which are oriented to form an angle • being smaller than 90° with respect to the optical axis A. In the illustrated embodiment, the angle • for adjacent first optical structures 110 increases as the distance to the centre of the top face 104 increases. In this way, the refractive power of the first optical structures 110 is largest in the middle of the top face 104 and decreases towards the edges of the top face 104.

Similarly, the side faces 106 are arranged to refract light originating from the LED 102 towards the optical axis A. In this way a uniform illumination pattern may be obtained, in particular if several LEDs are arranged in an array. Further, as the light is directed towards the optical axis A, the emitted light is less likely to hit any obstruction outside of the optical element prior to reaching its target, such as an adjacent LED. Hence, the efficiency is thereby improved. The side faces 106 may for example be straight and may for example form an angle with respect to the optical axis A that is not equal to 90 degrees. The angle of the side faces 106 with respect to the optical axis A may be chosen such that TIR is avoided at the side faces 106. Alternatively, one or more of the side faces 106 may be curved. As is further explained below, one or more of the side faces 106 may be multifaceted.

The geometrical size of the top face 104 in a direction perpendicular to the optical axis A is chosen such that TIR is avoided at the top face 104. Since TIR is avoided the efficiency losses due to the optical element 100 are very small. In more detail, the size of the top face 104 is chosen such that if the top face 104 had extended any further in a direction perpendicular to the optical axis A, light emitted by at least one point of the LED 102 would have been subject to TIR at the top face 104.

Figure 1B:
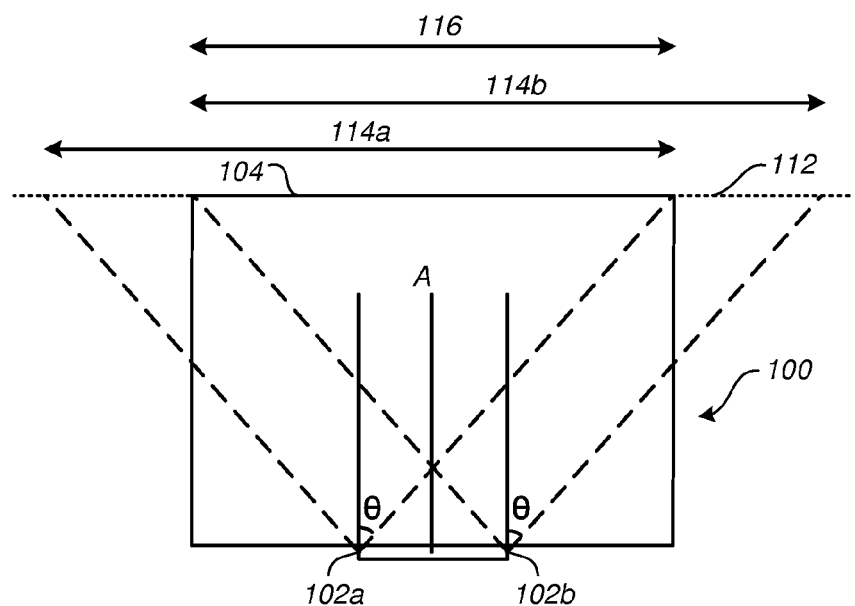

This is further illustrated in FIG. 1b which shows the LED 102 and the optical element 100 of FIG. 1 as well as an imaginary extension 112 of the top face. The emitting area of the LED 102 has a geometrical extent. As a consequence, each point of the LED 102, such as the illustrated points 102a-b, may emit light. Point 102a is the leftmost point of the LED 102 and point 102c is the rightmost point of the LED 102. For each of the points of the LED 102, such as points 102a-b, an associated angular range defined by an angle • relative to the optical axis A is defined. Here, angular ranges 114a-b are associated with the points 102a-b, respectively. The angle • is associated with an angle above which TIR of light emitted by the LED 102 would occur in the imaginary extension 112 of the top face 104. In other words, had the top face 104 extended any further, TIR would take place in the top face 104 for light emitted by the LED 102 above the angle •. Hence, light emitted by any point of the LED such as one of points 102a-b at an angle larger than the angle • would be subject to TIR as it reaches the imaginary extension 112 of the top face 104. The angle • may easily be calculated by the laws of refraction once the refractive index of the optical element 100 is known.

In order to avoid TIR at the top face 104, the top face 104 should not extend outside of any of the angular ranges which may be associated with any point of the LED 102. This is achieved by the top face 104 covering a first angular range 116 relative to the optical axis A which corresponds to the intersection of the angular ranges which may be defined for any of the points of the LED 102. In particular it may be seen to correspond to the intersection of the angular ranges 114a and 114b which may be defined for the peripheral points 102a and 102b of the LED 102. In this way, the top face 104 does not extend outside of any of the angular ranges 114a-b where TIR takes place and hence TIR in the top face 104 is avoided. Differently stated, outside of the first angular range 116, that is, at the imaginary extension 112, light emitted by at least one point of the LED 102 is subject to TIR.

Figure 2:
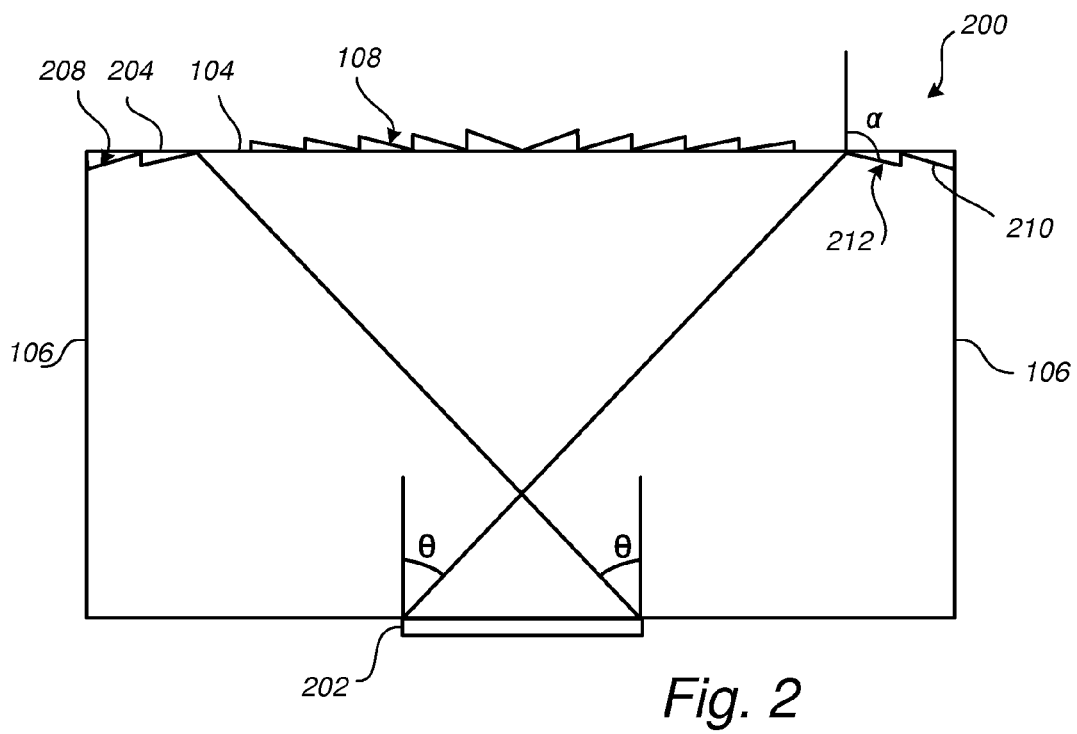

FIG. 2 illustrates an optical element 200 which is used together with a LED 202. This embodiment differs from the embodiment described with reference to FIG. 1a in that it further comprises an (non-imaginary) extension 204 of the top face 104. The extension 204 of the top face 104 extends in a direction perpendicular to the optical axis A such that it exclusively covers a second angular range extending outwardly of the first angular range 116 disclosed with respect to FIG. 1b. In other words, the first and second angular ranges are non-overlapping. Since the extension 204 covers a second angular range extending outwardly of the first angular range, TIR may occur at the extension 204 if no further means are taken. In order to avoid TIR in the extension 204 of the top face, the extension 204 comprises a second pattern 208. The second pattern 208 comprises a second optical structure 210 which is arranged to refract light towards the optical axis A. For example, this may be achieved by a second optical structure 210 having facets 212 which are oriented such that they define an angle • larger than 90° with respect to the optical axis A. For example, the angle • of adjacent second optical structures 210 may increase as the distance to the edges of the extension 204 of the top face decreases. The embodiment of FIG. 2 may be particularly useful when the top face cannot be given an arbitrary size for practical reasons but is restricted to certain conditions. For example, this embodiment may be used if the top face 104 is restricted to a size being equal to the size of the emitting area of the LED 102.

Between the pattern 108 of the first optical structures of the top face 104 and the second pattern 208 of second optical structures of the extension 204 of the top face, there may be a portion of the top face 104 where there are no optical structures. That portion may be seen to correspond to optical structures having an angle • equal to 90° with respect to the optical axis A.

Figure 3:
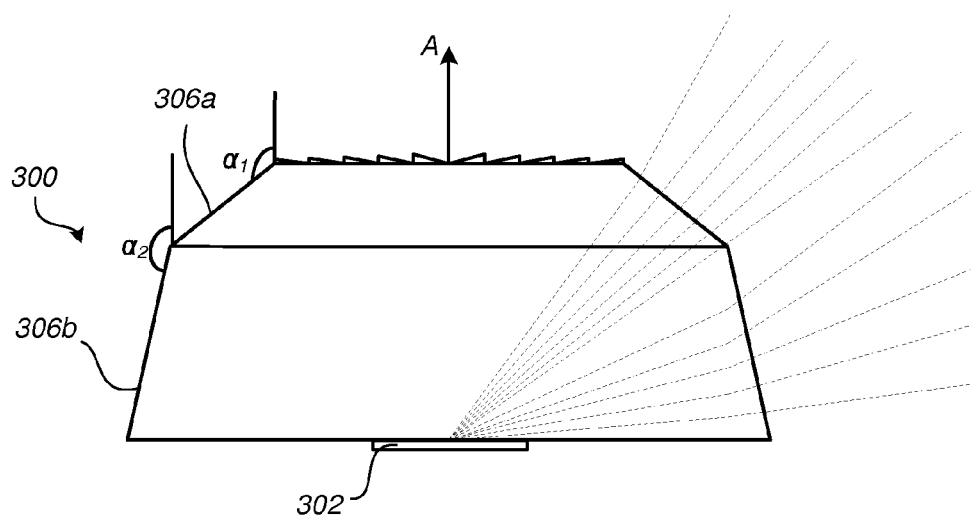

FIG. 3 illustrates an optical element 300 to be used with a LED 302. The optical element 300 has a top face 304 and side faces wherein at least one of the side faces comprises a first portion 306a being located closest to the top face 304 and a second portion 306b. In the illustrated embodiment, all side faces comprise a first and a second portion 306a and 306b. However, in general, different side faces may comprise different number of portions. The illustrated first portion 306a and the second portion 306b are essentially straight. For example, the first portion 306a and the second portion 306b may be in the form planar surfaces. The first portion and the second portion 306a and 306b may have different inclinations with respect to the optical axis A.

Particularly, the first portion 306a may have a first inclination defined by angle $\bullet_1$ with respect to the optical axis A, and the second portion 306b may have a second inclination defined by angle $\bullet_2$ with respect to the optical axis A, where $\bullet_2 > \bullet_1 > 90°$. For example, the inclination $\bullet_1$ of the first portion 306a may be chosen such that essentially no refraction of light occurs as light emitted by the LED 302 passes through the first portion 306a. At the same time, the inclination $\bullet_2$ of the second portion 306b may be chosen such that light emitted by the LED 302 is refracted towards the optical axis A. By varying the angles or inclinations and sizes of the different portions 306a-b of the side faces, the direction of the emitted light can be controlled.

In an alternative embodiment, the first portion 306a is curved, such that it has a shape of a second or higher order degree curve or surface. Alternatively, it may be in the form B-splines or rational Bezier curves. Alternatively, the cross-section of the first portion 306a may be in the shape of a segment of a circle. In this way, the first portion 306a may be designed to have a shape by which light emitted by the LED 302 impinges essentially perpendicularly on the first portion 306a such that essentially no refraction of the light is obtained.

Figure 4:
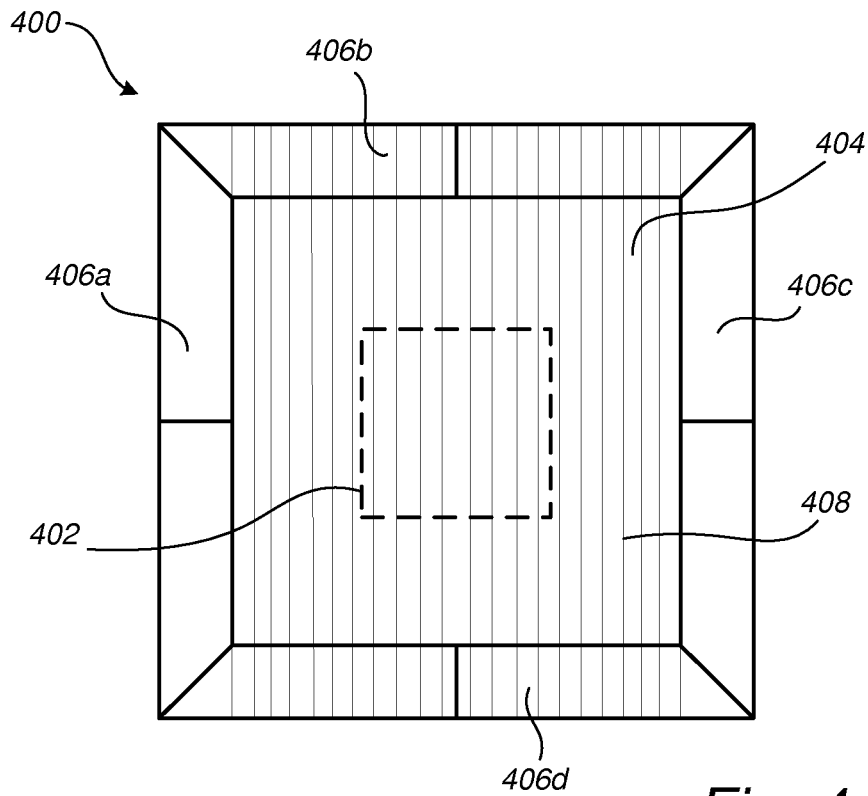
FIG. 4 is a top view of an optical element used together with a LED according to embodiments.

FIG. 4 is a top view of an optical element 400 having a top face 404 with a first pattern 408 and side faces 406a-d. The optical element 400 is used with a LED 402. In this embodiment, the first pattern 408 further extends to at least one of the plurality of side faces 406a-d. Here, the pattern extends to two side faces, namely the oppositely arranged side faces 406b and 406d. However, the pattern may also extend to all of the side faces 406a-d. In case the optical element 400 has side faces 406a-d being divided into different portions having different angles or inclinations as discussed above with respect to FIG. 3, the pattern 408 may extend to only one of the portions, to some of the portions, or to all portions. By having a first pattern of first optical structures also on the side faces 406, light emitted by the LED 402 is further refracted and spread out. In this way, the illumination distribution resulting from the LED 402 when used with the optical element 400 may be further improved. In particular, the illumination in a direction perpendicular to the optical axis may be improved.

Figure 5:
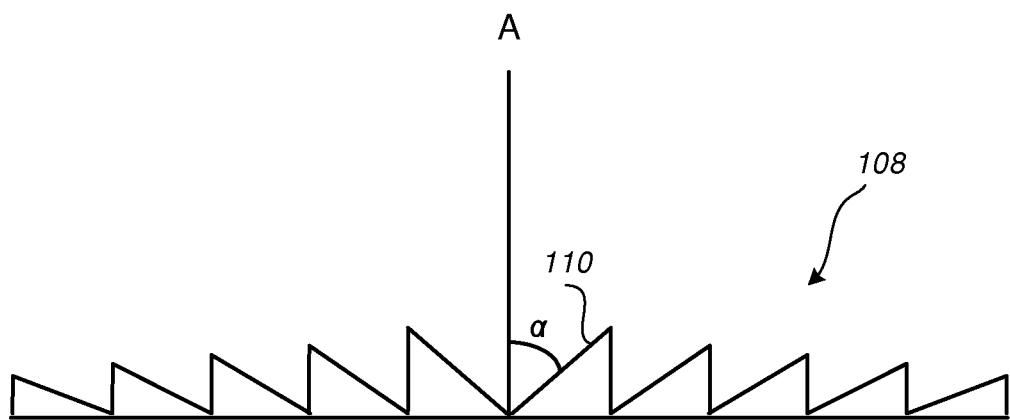
FIG. 5 is a cross-sectional view of structures on a top face of the optical element according to embodiments.

FIG. 5 illustrates an example of the first pattern 108 of first optical structures 110 of the top face. In principle, the first pattern 108 of first optical structures 110 may have any shape as long as it serves to refract light emitted by the LED away from the optical axis A. Here, the first pattern 108 comprises a plurality of adjacent first optical structures 110 having a saw tooth shaped cross-section. The saw tooth shaped first optical structures 110 have a top surface which is oriented to form an angle $\bullet$ being smaller than 90° with respect to the optical axis A. The angle $\bullet$ increases as the distance to the centre of the top face 104 increases. In this way, the refractive power of the first pattern 108 decreases towards to the edges of the top face.

In case the optical element comprises a second pattern, such as pattern 208 of FIG. 2, the second optical structures of the second pattern may also have a saw-tooth shape in cross-section.

Figure 6A:
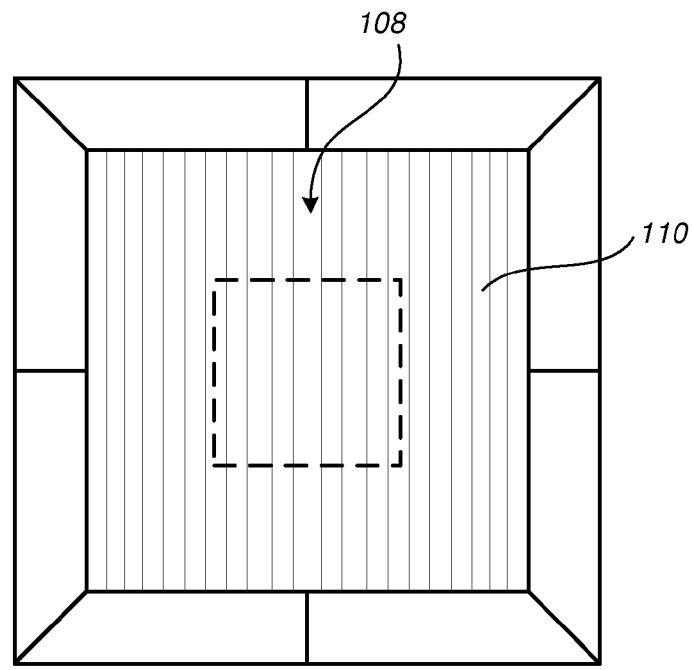
FIGS. 6a-b are top views of an optical element used together with a LED according to embodiments.
Figure 6B:
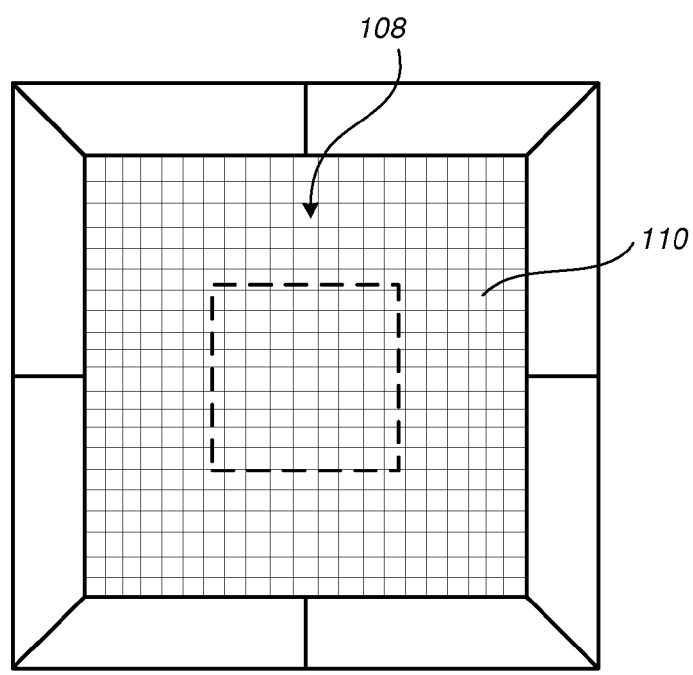

FIGS. 6a-b are examples of how the first pattern of first optical structures may be arranged on the top face of the optical element. In FIG. 6a the first optical structures 110 are arranged in a one-dimensional pattern. For example, the first optical structures 110 may be in the form of ridges being arranged adjacent to each other to form the resulting pattern 108. The ridges may for example have saw-tooth shaped cross-sections as described with respect to FIG. 4. By arranging the first optical structures 110 in a one-dimensional pattern, spreading of the light in one direction is achieved.

In FIG. 6b the first optical structures 110 are arranged in a two-dimensional pattern. For example, the individual first optical structures 110 forming the first pattern 108 may be in the form of half-pyramids being arranged adjacent to each other. Other alternatives are quarter spheres or ellipsoids. By arranging the first optical structures 110 in a two-dimensional pattern, the light is spread in two directions.

The examples disclosed above also apply to the second pattern 208 disclosed with respect to FIG. 2.

Figure 7A:
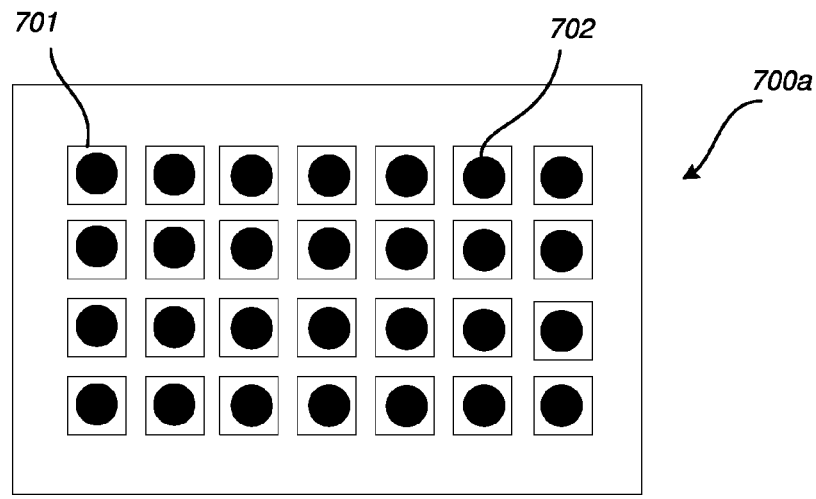
FIGS. 7a-b illustrate top views of arrangements of LEDs and optical elements according to embodiments.
Figure 7B:
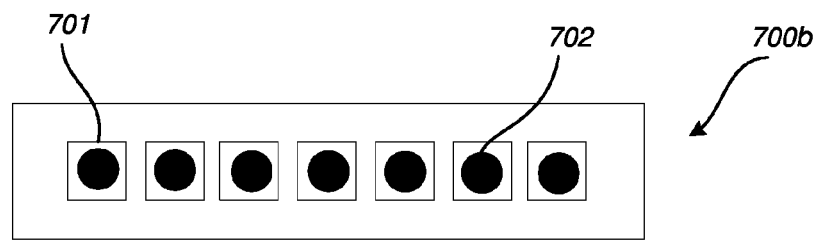
Figure 7C:
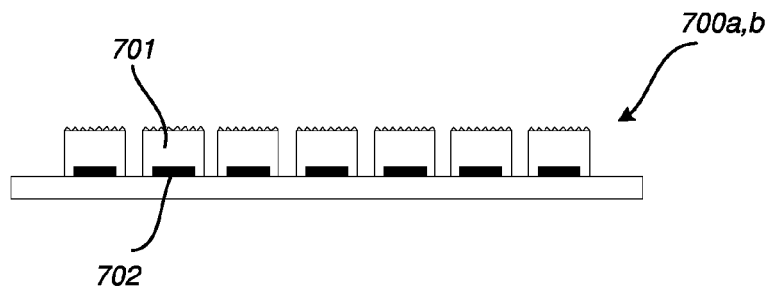
FIG. 7c is a side view of the arrangements of FIGS. 7a-b.

FIGS. 7a-c illustrate examples of LED arrangements comprising optical elements according to the embodiments described above. The LEDs may for example be phosphor coated LEDs emitting white light or LEDs emitting blue light with a remote phosphor. FIG. 7a illustrates a rectangular light source comprising a plurality of LEDs 702 and a plurality of optical elements 701. The LEDs 702 are arranged in a rectangular array. Similarly, FIG. 7b illustrates a linear light source 700b comprising a plurality of LEDs and a plurality of optical elements 701. The LEDs 702 are arranged in a linear array. Each LED 702 of the rectangular array and the linear array is associated with one of the plurality of optical elements 701 being placed on top of the LED or formed integrally with it as illustrated in FIG. 7c.

Figure 8:
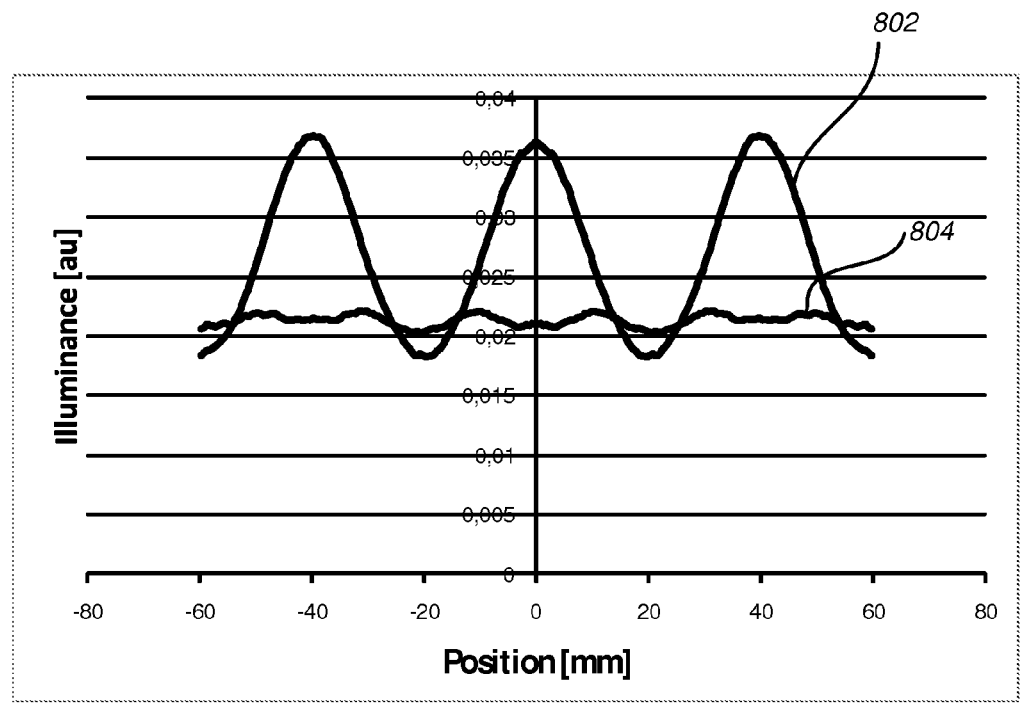
FIG. 8 illustrates the illuminance distribution of a linear LED arrangement. As illustrated in the figures, the sizes of layers and regions are exaggerated for illustrative purposes and, thus, are provided to illustrate the general structures of embodiments of the present invention. Like reference numerals refer to like elements throughout.

By associating each LED 702 with an optical element 701, the illumination distribution of the resulting light source 700a or 700b is improved, meaning that the illumination distribution is more uniform compared to the case where no optical elements 701 are used. FIG. 8 illustrates the illumination distribution of a linear light source having three LEDs arranged at a distance of 50 mm from each other. The illumination plane is at a distance of 20 mm from the LEDs. Curve 802 represents the illuminance distribution when no optical elements are present and curve 804 represents the illuminance distribution with optical elements present. From FIG. 8 it clearly follows that the illuminance distribution is more uniform when optical elements are used. In practice this means that the spotty appearance of the light source is reduced, and that in the case of remote phosphor applications the lifetime is increased due to the reduction of hot spots in the phosphor layer.

The person skilled in the art realizes that the present invention by no means is limited to the preferred embodiments described above. On the contrary, many modifications and variations are possible within the scope of the appended claims. For example, the side faces may comprise more than two portions having different shapes. Further, there are many alternatives regarding the shape of the first optical structures of the top face.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:
1. An optical element for use with a LED, comprising:
  a base face arranged to receive incoming light from the LED,
  a top face having a normal extending in a direction from the base face (103) to the top face and defining an optical axis, wherein the top face extends such that it covers a first angular range relative to the optical axis, outside of which first angular range light emitted by at least one point of the LED would be subject to total internal reflection at an imaginary extension of the top face, and wherein the top face comprises a first pattern of first optical structures which are arranged to refract light originating from the LED away from the optical axis;

a plurality of side faces extending between the base face and the top face, the plurality of side faces being arranged to refract light originating from the LED towards the optical axis; and wherein an extension of the top face extending such that it exclusively covers a second angular range extending outwardly of said first angular range, wherein the extension of the top face comprises a second pattern comprising second optical structures having top surfaces which are oriented to form an angle larger than 90 degrees relative to the optical axis (A).

2. The optical element according to claim 1, wherein the plurality of side faces are inclined with respect to the optical axis.

3. The optical element according to claim 2, wherein at least one of the plurality of side faces comprises a first portion and a second portion having different inclinations with respect to the optical axis.

4. The optical element according to claim 2, wherein all side faces have the same inclination with respect to the optical axis.

5. The optical element according to claim 1, wherein all side faces have the same geometrical dimensions.

6. The optical element according to claim 1, wherein the first pattern of the top face extends to at least one of the plurality of side faces.

7. The optical element according to claim 1, wherein the first optical structures each have a top surface which is oriented to form an angle being smaller than 90 degrees with respect to the optical axis and wherein the angle increases as the distance to the centre of the top face increases.

8. The optical element according to claim 7, wherein the first optical structures are saw-tooth shaped in cross-section.

9. The optical element according to claim 1, wherein the first optical structures are arranged in a one-dimensional pattern.

10. The optical element according to claim 1, wherein the first optical structures are arranged in a two-dimensional pattern.

11. A light emitting device comprising an optical element according to claim 1 formed integrally with an LED.

12. A LED arrangement comprising
a LED, and
an optical element according to claim 1, the optical element being associated with the LED.

13. The LED arrangement according to claim 12, comprising a plurality of LEDs each being associated with an optical element, wherein the plurality of LEDs are arranged in a one-dimensional array.

14. The LED arrangement according to claim 12, comprising a plurality of LEDs each being associated with an optical element, wherein the plurality of LEDs are arranged in a two-dimensional array.

* * * * *